United States Patent [19]

Kotval et al.

[11] 4,195,067
[45] Mar. 25, 1980

[54] PROCESS FOR THE PRODUCTION OF REFINED METALLURGICAL SILICON

[75] Inventors: Peshotan S. Kotval, Hartsdale; Harold B. Strock, North Tarrytown, both of N.Y.

[73] Assignee: Union Carbide Corporation, New York, N.Y.

[21] Appl. No.: 853,758

[22] Filed: Nov. 21, 1977

[51] Int. Cl.$^2$ ............................................. C01B 33/02
[52] U.S. Cl. ................................. 423/348; 23/295 R; 23/296; 156/616 R; 156/DIG. 64
[58] Field of Search ............. 423/348; 23/295 R, 296; 156/616 R, DIG. 64

[56] References Cited

U.S. PATENT DOCUMENTS

| | | | |
|---|---|---|---|
| 1,180,968 | 4/1916 | Brockbank | 423/348 |
| 2,749,216 | 6/1956 | Dinwiddie et al. | 423/630 |
| 3,012,865 | 12/1961 | Pellin | 423/348 X |
| 3,097,068 | 7/1963 | Litz et al. | 423/348 |
| 3,871,872 | 3/1975 | Downing et al. | 423/348 X |

FOREIGN PATENT DOCUMENTS

| | | | |
|---|---|---|---|
| 874547 | 8/1961 | United Kingdom | 423/348 |
| 907855 | 10/1962 | United Kingdom | 423/348 |

*Primary Examiner*—Jack Cooper
*Attorney, Agent, or Firm*—Alvin H. Fritschler

[57] ABSTRACT

Silicon platelets essentially free of iron are precipitated from a solution of metallurgical grade silicon in molten aluminum and are melted in contact with silica slag to produce a refined metallurgical silicon (RMS). By directionally solidifying the refined silicon-slag melt, a directionally solidified refined metallurgical silicon (DS/RMS) is separated from a region of solidified melt having a high concentration of impurities rejected by the silicon as it solidifies. The resulting RMS and DS/RMS materials are low-cost, multigrained products having a substantially higher impurity content than in conventional high purity semiconductor grade silicon while, at the same time, have suitable properties for desirable solar cell and other silicon applications.

40 Claims, No Drawings

PROCESS FOR THE PRODUCTION OF REFINED METALLURGICAL SILICON

BACKGROUND OF THE INVENTION

1. Field of the Invention

This invention relates to low-cost refined, metallurgical silicon materials. More particularly, it relates to the production of such silicon materials having desirable properties for solar cell applications.

2. Description of the Prior Art

The development of new techniques and products for the low-cost utilization of non-polluting sources of energy is of paramount national and world-wide interest. Solar energy is among the energy sources of greatest interest because of its non-polluting nature and of its abundant, non-diminishing availability. Two separate approaches have been utilized in efforts to develop solar energy as a suitable energy source for satisfying significant portions of the ever-increasing energy requirements of modern, industrial societies. In one approach, solar energy is converted into thermal energy, while the second approach involves the conversion of solar energy into electricity by means of the photovoltaic effect upon the absorption of sunlight by so-called solar cells. The present invention relates to the second approach and to the development of low-cost silicon materials for use in such solar cells.

Silicon solar cells, the most commonly employed devices based on said photovoltaic effect, have been employed reliably in space craft applications for many years. For such applications and for industrial and commercial applications in general, crystals of high purity, semiconductor grade silicon are commonly utilized. Such high purity, high perfection silicon is prepared by rather costly procedures involving converting metallurgical grade silicon to trichlorosilane, which is then reduced to produce polycrystalline, semiconductor grade silicon from which single crystals can be grown. The costs associated with the production of such high purity, high perfection crystals are high. For example, polycrystalline semiconductor grade silicon made from metallurgical grade silicon costing about $0.50/lb. will presently cost on the order of about $30/lb. and up. A single crystal is grown from this semiconductor grade material, the ends of the single crystal ingot or boule are cut off, and the boule is sawed, etched and polished to produce polished wafers for solar cell application, with mechanical breakage and electronic imperfection reducing the amount of useable material obtained. As a result of such processing, less than 20% of the original polycrystalline, semiconductor grade silicon will generally be recovered in the form of useable wafers of single crystal material. The overall cost of such useable material is, accordingly, presently on the order of about $300/lb. and up. Because of the relatively large area requirements involved in solar cell applications, such material costs are a significant factor in the overall economics of such applications.

The economic feasibility of utilizing solar cell technology for significant portions of the present and prospective needs for replenishable, non-polluting energy sources would be enhanced, therefore, if the utilization of high cost, high purity, high perfection single crystal wafers could be avoided. Previous efforts to refine metallurgical silicon for other applications, however, have not resulted in the production of materials that can be utilized in solar cells although the electronic characteristics of various grades of silicons for solar cells are less stringent than, for example, such silicons as employed for complex circuitry in the electronics industry.

Metallurgical silicon has heretofore been refined by slag oxidation to obtain a grade of metallurgical silicon or ferrosilicon advantageous as an alloying additive in the manufacturing of steels. As indicated in the Barber et al patent, U.S. Pat. No. 2,797,988, and elsewhere, the slag oxidation approach has been utilized to remove impurities and thus to purify and refine silicon having an iron content therein such that the refined product constitutes a ferrosilicon in which iron is considered an integral part of the final refined product. For use of silicon as a substrate in planar diodes and solar cells made therefrom, however, it is necessary that the refined silicon have as low an iron content as possible as such iron is a deleterious impurity in a solar cell material. As indicated above, this circumstance is in contradistinction to the benign nature of the iron content of the refined silicon product as utilized in the steel industry.

Silicon has also been purified heretofore by the dissolution and subsequent precipitation of silicon from a liquid metal system. Such purification, taught by Litz, U.S. Pat. Nos. 3,097,068 and Wakefield, 3,933,981, involve the retention of silicon impurities by the liquid metal solvent when dissolution takes place at a higher temperature and, subsequently, the temperature is lowered to precipitate a relatively pure silicon. Such a silicon product is not suitable for use as a substrate in solar cell applications, however, since the liquid metal of the solvent phase is present as an impurity in the product silicon so obtained in this processing technique.

While Litz states that the product of such refining by liquid metal solvent is too impure for use in transistors, use for rectifiers and solar batteries is indicated. The product, however, is said to contain 200 to 700 ppm of aluminum, with no mention of its iron content. Such a level of aluminum would render the product purified by the Litz technique unsuitable for solar cell application. Litz also discloses a further lengthy and expensive procedure using silicon tetrachloride to reduce the aluminum content to 9 ppm.

Other efforts to develop acceptable solar cell materials have likewise resulted either in high cost, or high impurity levels such that acceptable efficiencies can not be obtained, or a combination of these disadvantages. An acceptable efficiency for a low-cost, relatively impure silicon would, of course, very likely represent some loss from the high purity, single crystal material made from semiconductor grade silicon. Such high-cost material is capable of providing efficiencies of about 13–14%. The lower cost of relatively impure silicon material, particularly multigrained material, might well constitute an advantageous trade-off enhancing the overall technical-economic feasibility of utilizing silicon solar cell technology in significant commercial operations.

The practical lower limit for economic solar cell efficiencies is about 7–8%. One attempt to produce an acceptable low-cost material has involved the pulling of ribbons from a melt of metallurgical grade silicon by known techniques. While such ribbons pulled from semiconductor grade material have obtained efficiencies of up to 10%, the ribbon pulled from metallurgical silicon is relatively dirty and impure, with solar cell efficiencies obtained from such ribbon being limited to about 5%.

Another approach has involved the pulling of boules, in a multiple series of refining steps, from metallurgical grade silicon as a starting material by the known Czochralski-pulling technique. By re-melting and re-pulling refined, multigrained silicon in a several stage process, a single crystal refined silicon is ultimately obtained that is capable of achieving efficiencies of about 8%. The cost of such material, however, is relatively high because of the multiple pulling steps involved.

Chu, U.S. Pat. No. 3,961,997, discloses the fabrication of low-cost solar cell substrates from metallurgical grade, polycrystalline silicon. In this approach, successive layers of polycrystalline silicon containing appropriate dopants are deposited over substrates of metallurgical grade silicon, graphite or steel coated with particular diffusion barrier materials. The resulting products contain a high level of impurities such that efficiencies obtainable by modifications of this approach have not exceeded about 3-5%.

A genuine need thus exists for low-cost, relatively impure silicon products suitable for use in solar cells of acceptable efficiency. The resulting low-cost solar cells should preferably have efficiencies in excess of about 10%, with 7-8% representing a practical lower limit of efficiency as indicated above.

It is an object of this invention, therefore, to provide low-cost refined metallurgical silicon products suitable for solar cell applications.

It is another object of the invention to provide refined metallurgical silicon of a relatively impure nature as compared with semiconductor grade material while having useful properties for said solar cell applications.

It is a further object of the invention to provide multigrained refined metallurgical silicon useful for solar cell applications or readily convertible to such useful silicon material.

With these and other objects in mind, the invention is hereinafter described, the novel features thereof being particularly pointed out in the appended claims.

SUMMARY OF THE INVENTION

The objects of the invention are accomplished through the slag oxidation of partially purified silicon platelets precipitated from a solution of metallurgical grade silicon in a molten metal solvent such as aluminum. The precipitated platelets are obtained by cooling a supersaturated solution of metallurgical grade silicon in said solvent, filtering said platelets and washing the recovered platelets with acid or anhydrous alcohols to remove adherent materials therefrom. Upon cooling, a thus-refined, low-cost multigrained, refined metallurgical silicon (RMS) is obtained at a substantially higher impurity content level than in conventional high purity semiconductor grade material. The refined silicon product is, nevertheless, of sufficient purity to permit such material to be utilized in the preparation of low-cost substrates suitable for planar diode and solar cell applications.

By directionally solidifying the silicon-slag melt following slag oxidation, a low-cost, multigrained, directionally solidifed refined metallurgical silicon (DS/RMS) is obtained, said product having suitable properties for desirable solar cell and other silicon applications.

DETAILED DESCRIPTION OF THE INVENTION

The present invention provides a low-cost alternative to the utilization of semiconductor grade material in the development and application of solar cell technology. While high-cost, high-purity, high-perfection single crystal silicon wafers are undoubtedly of value for specialized solar cell applications, the necessity for achieving a more commercially feasible cost structure is a major factor in the growth and development of solar cell technology for general industrial and commercial applications. As noted above, the large area requirements of solar cells, which are, in effect, simple large area planar diodes, render material costs a significant factor in the economic feasibility of solar cells vis-a-vis other presently available energy sources. By means of the present invention, practical, large-scale solar cells can be made from grades of silicon having substantially higher impurity levels than in the extremely high purity semiconductor grade silicon heretofor employed for solar cell purposes.

Semiconductor grade silicon from which high cost, high purity single crystals are grown generally has a resistivity, measured as a manifestation of uncompensated charged carriers, of from 1 to 10 ohm-cm or higher, with the resulting single crystal wafers prior to junction formation having resistivities of on the order to 50 to 200 ohm-cm. The present invention, on the other hand, utilizes low-cost refined metallurgical products having resistivities in the range of from about 0.04 to about 0.2 ohm-cm. While high cost, high purity single crystal wafers have impurity levels for each impurity element that are beyond the limits of detection by normal chemical analytical properties and are manifest by resistivity measurements, the low-cost refined metallurgical products of the present invention can have significantly higher impurity levels for various of said significant impurity elements while, nevertheless, having sufficient overall purity to serve as a practical solar cell substrate having a p-n junction grown on, or diffused therein, by known epitaxial or diffusion methods.

In the practice of the present invention, metallurgical grade silicon is refined but without conversion to semiconductor grade material. Metallurgical grade silicon, as referred to herein, is a grade of silicon having a resistivity on the order of 0.005 ohm-cm and up to 3% iron, up to 0.75% aluminum, up to 0.5% calcium and other impurities normally found in silicon produced by the carbothermic reduction of silica. It is also within the scope of the invention to employ a ferrosilicon material containing at least about 90% Silicon and up to 10% or more of iron. Such metallurgical grade silicon or ferrosilicon is processed, for purposes of the present invention, by solvent refining to reduce the iron content and other impurities after which the partially purified silicon is melted in contact with acid silica slag with the resultant slag oxidation producing a refined metallurgical silicon (RMS) from which other products useful in solar cell applications are produced as described herein.

In the initial iron removal step, silicon platelets essentially free of iron are removed from a solution of metallurgical grade silicon in a liquid metal solvent. While such metals as tin, zinc and silver may be employed, aluminum is the preferred solvent for use in the practice of the present invention. It will be understood that the term "aluminum" is intended to cover aluminum and alloys of aluminum. Primary ingots of 99.5% to 99.9% purity and above may be used, with 99.9% nominal purity primary aluminum ingot being preferred. Aluminum alloys are also generally suitable for purposes of the invention. One such alloy that has been used contains 1% silicon and iron, 0.2% copper, 0.05% manganese and 0.1% zinc. Another such alloy contains 0.21% iron, 3% copper, 0.025% manganese, 0.88% magnesium and 0.2% chromium. The solvent purity decreases, of course, with increasing cycles of fresh silicon charge dissolution therein.

The temperature and aluminum (or other metal)/silicon ratio limits used in dissolving the metallurgical grade silicon are determined by the metal-silicon binary phase diagram. Employing aluminum as the metal solvent, silicon must be removed by cooling the liquid solution of silicon in molten aluminum to a temperature not below the eutectic temperature of about 577° C., thus forming a hypereutectic aluminum-silicon solution and causing silicon platelets to precipitate therefrom. At the eutectic temperature, 11.7% silicon is dissolved in aluminum. A homogeneous solution is formed at the high temperature dissolution point with up to 80% silicon in aluminum, preferably between 55% silicon at 1100° C. and 20% silicon at about 700° C., although temperatures closer to 600° C. may be feasible depending on the precision of the silicon-aluminum separation procedures employed. While silicon will commonly be added to molten aluminum or other liquid metal solvent, it is within the scope of the invention to add aluminum or other metal to molten silicon.

In cooling the solution, rapid cooling rates produce smaller precipitated silicon platelets than more costly, slower cooling rates. The solution should preferably be cooled at the fastest rate that will produce platelets of acceptable purity and size. Platelets of ¼" or larger, suitable for ready separation from the silicon-aluminum melt by filtration, have been obtained at a cooling rate of 60° C./hour, with no advantage having been obtained at slower cooling rates down to 20° C./hour. The upper range of such cooling rates will likely depend on the geometry of the particular apparatus employed and will likely be in the order of about 200° C./hour, with heat transfer limitations possibly dictating the fastest cooling rates possible for large melts.

The solvent refining step of the invention may be carried out in any crucible that does not react with and/or contaminate the silicon-solvent metal alloy melt. Carbon or graphite crucibles are preferred but other non-reactive materials, such as refractory oxides, can also be employed. A non-oxidizing atmosphere, such as nitrogen, argon, helium or hydrogen-carbon monoxide mixtures can be employed to maximize the life of the crucible and related heating elements. While mechanical or other stirring is optional after the refined metallurgical silicon and metal solvent have been mixed, it is desirable to continue stirring during silicon dissolution, but stirring may be undesirable during silicon precipitation if it creates small platelet sizes such as to make platelet separation from the melt difficult.

While the invention is herein described particularly with reference to aluminum as the liquid metal solvent, it will be appreciated that the processing is applicable to embodiments in which other suitable solvents, such as those disclosed above, are employed, particular operating conditions, such as temperatures, metal/silicon ratios, cooling rates and the like being varied depending on the particular characteristics of any specific metal-silicon system.

For practical, commercial operations, the platelets will range generally from about 1/10 to 1 inch in size and will be removed from the solution of metallurgical grade silicon in the aluminum or other liquid metal solvent while it is still molten. For this purpose, the entire melt can be filtered through a suitable filter, such as perforated carbon plates, quartz wool and stainless steel screens. The partially purified, essentially iron-free silicon platelets float on the melt and, in an alternate removal technique, can be scooped from the solution melt surface as a semi-solid mass comprising said platelets and excess aluminum-silicon eutectic. In a generally preferred approach, this mass is subjected to centrifugal filtration to separate the partially purified silicon platelets from said excess eutectic material. The recovered essentially iron-free platelets will nevertheless have some adherent impurities derived from the metal solvent associated therewith. For example, using a centrifugal filter operating at 400 rpm, silicon platelets having only about 9% aluminum can be obtained from a semi-solid mass of crystallized platelets and eutectic fed to said filtration step at an overall gross composition of approximately 50% aluminum/50% silicon.

The adherent material, e.g. aluminum-silicon eutectic, is advantageously removed from the filtered platelets before the partially purified platelets are contacted with silica slag to produce a refined metallurgical silicon (RMS). In one embodiment of the invention, such adherent impurities can be removed from the platelets by acid leaching, with any suitable aqueous inorganic acid solution being employed in a wide range of suitable concentrations. Aqueous HCl solutions in concentrations of about 4 to about 37% by weight are generally preferred. To assure complete washing, the platelets are desirably crushed and passed, for example, through a 6 mesh screen, boiled in concentrated aqueous HCl for up to an hour, and finally washed in boiling water.

In an alternate embodiment, the adherent eutectic may be removed from the filtered platelets by washing the platelets with anhydrous alcohols, e.g. isopropyl alcohol or amyl alcohol, said alcohols reacting with the aluminum in said eutectic to form aluminum alkoxides, i.e. $Al(OR)_3$. The alkoxide has a resale value and, in a further embodiment, can be hydrolyzed to form hydrous aluminum oxide and the alcohol, which can be recycled for the washing of additional platelets. This embodiment thus represents a clean closed cycle process that may be less expensive than the acid leach referred to above even if a final HCl or other acid leach step were employed for the partially purified silicon material thus washed with said anhydrous alcohol.

Following the removal of adherent eutectic, the partially purified silicon will be essentially iron-free, having an iron content generally within the range of from about 3 to about 90 ppm, more typically, not exceeding about 20 ppm, i.e. parts per million parts by weight of said purified material. The aluminum content of said material will generally be in the range of from about 0.1 to about 0.5% by weight of said material, typically about 0.2% by weight. It is believed that the acid leaching or alcohol washing may effect some impurity removal beyond the removal of said eutectic. Iron removal in the eutectic removal operation would, of course, represent a further advantage—compensating in part for the cost of said step and its related waste acid environmental considerations.

The partially purified silicon platelets essentially free of iron, are thereafter melted in contact with a silica slag in a melting zone to remove residual and adherent impurities from the platelets. While the solvent refining step described above results in a drastic reduction in the iron and titanium content of metallurgical silicon, microscopic inclusions of aluminum eutectic remains within the platelets. The slag oxidation occurring upon contact of the partially purified platelets with said silica slag results in the removing of residual and adherent impurities, including said aluminum eutectic, that are detrimental to the production of an acceptable solar cell substrate material capable of achieving a satisfactory level of solar cell efficiency. It will be understood that the platelets thus exposed to slag oxidation include such platelets as treated by means such as those above, including crushing, for the removal of adherent impurities from the partially purified platelets.

The partially purified silicon is contacted with said slag at temperatures above the melting point of silicon, e.g. at temperatures of from about 1410° C. to about 2000° C. Lower temperatures, from about 1410° C. to about 1600° C., are more efficient for oxidative removal of aluminum from silicon, with temperatures of from about 1410° C. to about 1500° C. being generally preferred. Lower temperatures, e.g. down to about 750° C., are less preferred. In general, the slag melting point should be less than the highest silicon melt temperature during slagging for rapid reaction kinetics.

In the practice of the slag oxidation step of the invention, silicon metal platelets are mixed with high purity slag powder and the mixture is heated to the contact temperature range indicated above. Alternatively, high purity slag powder components, preferably at a temperature of from about 1,000°–1200° C., can be added directly to a melt of said silicon in a suitable crucible. Since the crucible must not contaminate the melt, most metal and metal carbides cannot be used therein. Carbon, silicon carbide, silicon nitride or silicon dioxide crucibles or crucible coatings are generally preferred. Any atmosphere that protects the crucible and melt from oxidation, such as argon, helim or nitrogen, is desirable with nitrogen being preferred for economic reasons.

The slag removes aluminum from the silicon, by oxidation, and dissolves the product $Al_2O_3$ with low resultant activity as is generally known in the art. For this purpose, high silica acid slags, i.e. slags in which the Si/O ratio lies between about $\frac{1}{4}$ and about $\frac{1}{2}$, are employed. Since silicon reduces FeO and $TiO_2$ impurities in the slag and introduces them, as Fe and Ti, into the silicon, it is necessary that the highest purity slag components be employed for advantageous results.

The amount of slag employed will generally be on the order of from about 8% to about 12% by weight based on the weight of silicon although larger amounts up to 20% or more may also be employed. A slag content of about 10% is preferred, although it will be understood that commercially available slags may exist and have utility for purposes of the invention but at concentrations varying somewhat from those indicated herein. It is also within the scope of the invention to employ multiple slag steps, e.g. at said 10% slag concentration, to progressively lower the impurity level of the silicon being treated.

The slag should desirably contain less than about 10 ppm of each impurity reducible by molten silicon at the slag-silicon contacting temperature. Such impurities include FeO, $TiO_2$, $Cr_2O_3$, $B_2O_3$ and $V_2O_5$.

Any commercially available, high silica acid slag composition can be employed for the aluminum and other impurity removal purposes of the present invention. Illustrative examples of such available slag compositions are those having 65–100% $SiO_2$, 0–20% MgO and 0–35% CaO, preferably 65% $SiO_2$, 10% MgO and 25% CaO; those having 45–55% $SiO_2$ and 55–45% BaO, with 45% BaO/55% of $SiO_2$ being preferred; and those having 50–85% $SiO_2$, and 15–50% $Na_2O$, with 75% $SiO_2$/25% $Na_2O$ being preferred.

Enhanced slag-silicon contact speeds the purification reactions, and, thus stirring is preferred although the process is operable in the absence of stirring. Operable stirring rates are those that minimize melt splashing, such as rates of about 1–100 rpm.

After the slag oxidation reaction in the melting zone has removed residual and adherent impurities, particularly including aluminum from the silicon, the thus-slagged silicon is removed from the melting zone and cooled, as by chill casting. The resulting solidified product is a low-cost, multigrained refined metallurgical silicon (RMS) having a substantially higher impurity content level than in conventional, high purity semiconductor grade silicon but nevertheless constituting a valuable intermediate in the production of solar cell substrates.

In another embodiment of the invention, the silicon-slag melt is removed from the melting zone in a unidirectional manner so as to directionally solidify the silicon. For this purpose, the silicon-slag melt is slowly withdrawn, in its refining crucible, from the melting zone, as by slowly lowering the refining crucible from said zone. For example, the invention has been practiced in operations in which the refining crucible has been slowly withdrawn from the melting zone at a rate of approximately one inch per hour. The slow withdrawal of the crucible results in the unidirectional solidification, or freezing, of the charge that initially is entirely molten. Such directional solidification results in the obtaining of solidified refined metallurgical silicon and a region of solidified melt having a high concentration of impurities rejected by the refined silicon as it solidifies. Thus, there is no build-up of impurities at the solidification interface, and the impurities are uniformly distributed in the melt as silicon slowly solidifies in a unidirectional manner therefrom. The directionally solidified refined metallurgical silicon (DS/RMS) thus obtained is a low-cost multigrained silicon having a substantially higher impurity level than in conventional high purity semiconductor grade silicon while, at the same time, having suitable properties for desirable solar cell applications. It will be appreciated that it is also within the scope of the invention to re-melt said DS/RMS and to directionally solidify the silicon again to obtain further separation of refined silicon from a solidified melt of high impurity concentration.

Upon solidification of a silicon-slag melt, the interface between the slag and the silicon is not always well defined, resulting in the possibility of some material wastage. Upon directional solidification, the separation of silicon and slag is good. It has generally been found that when a quartz container is used to hold the reaction mixture, the slag is on the bottom and the silicon on the top, whereas the positioning appears to be reversed when a graphite crucible is employed. The DS/RMS having large columnar grains can readily be mechanically separated from the solidified melt having small grains of high impurity concentration when the mass is cold.

The RMS and DS/RMS multigrained products produced in accordance with the present invention have resistivity values, using a 4-point probe method, within the range of from about 0.04 to about 0.2 ohm-cm, whereas semiconductor grade silicon has a resistivity of greater than 10 ohm-cm. The resistivity is a manifestation only of uncompensated charge carriers. The resistivity is determined by the number of uncompensated impurity atoms present, and is thus a measure of the utility of the silicon that is different than the range of chemical composition of the silicon. The chemical composition per se can be misleading since impurities of Group III and Group V elements compensate each other electronically. It will also be appreciated that the precise composition of any particular RMS or DS/RMS product will vary depending on a variety of the processing conditions set forth above, and on the composition of the metallurgical grade silicon starting material, the liquid metal solvent, the silica slag and various other factors. Because of all or a combination of these factors, the concentration of individual impurities in the product is subject to considerable variation, the overall impurity level being such that the low-cost, multigrained products of the invention have suitable properties for desirable solar cell and other silicon applications although said impurity level is substantially higher than in conventional high purity semiconductor grade material. Thus, the RMS product, having a resistivity of from about 0.04 to about 0.2 ohm-cm, typically about 0.1 to about 0.2 ohm-cm, may have impurity concentrations of up to, but not generally exceeding, about 15 ppm of aluminum, about 80 ppm of iron, about 15 ppm of titanium, about 2 ppm of boron, about 2 ppm of phosphorus, about 10 ppm of chromium, about 100 ppm of calcium and about 65 ppm of magnesium. In particular, embodiments of the invention, various impurities may have a concentration considerably below these limits and, it will be appreciated, concentrations of individual impurities may somewhat exceed the limits specifically set forth without significant deviation from the scope of the invention. Thus, aluminum and iron contents of on the order of 10 ppm have been obtained particularly with a calcium-magnesium type slag. While the use of a sodium-type slag has resulted in an aluminum content of about 5 ppm, the corresponding iron level was about 80 ppm. Likewise, calcium and magnesium levels of about 100 ppm and 63 ppm, respectively, were obtained when a calcium-maganese slag was employed, with such levels being about 1 ppm and 4 ppm, respectively, when a sodium-type slag was employed. These examples will serve to illustrate the innumerable variations in composition obtainable for the RMS products of the invention within the overall composition levels and resistivity values indicated above. It will be appreciated that the term "ppm", as used herein shall mean parts per million by weight unless otherwise noted.

Likewise, the DS/RMS products of the invention have been found to have a resistivity of from about 0.04 to about 0.2 ohm-cm, typically from about 0.1 to about 0.2 ohm-cm. Such products may have impurity concentrations of up to, but not generally exceeding, about 1 ppm of aluminum, about 1 ppm of iron, about 2 ppm of titanium, about 2 ppm of boron, about 2 ppm of phosphorus, about 1 ppm chromium, about 1 ppm of calcium and about 1 ppm of magnesium. Once again, it should be noted that various individual impurities may depart somewhat from the specific limits indicated without departure from the scope of the invention. It should also be noted that, although the impurity levels for DS/RMS are lower than for RMS, the resistivity values are within the same general range, denoting that the number of uncompensated impurity atoms was approximately the same at the different impurity concentration levels. As indicated above, semiconductor grade material will have resistivities up to 10 ohm-cm or more, together with very low concentration levels beyond the limits of detection for each impurity. The RMS and DS/RMS of the present invention, therefore, represent relatively impure grades of silicon having, nevertheless, desirable utility in the production of solar cell substrates and for other known silicon applications, such as in rectifiers, where the purity requirements are less restrictive than in transistor uses and specialized solar cell applications in which high purity silicon made from semiconductor grade material is required regardless of the cost thereof.

The invention is further illustrated, but not limited, by the following specific examples:

EXAMPLE 1

Four hundred grams of silicon metal containing 1.25% Fe and 0.48% aluminum were dissolved in 865 grams of molten aluminum alloy solvent, said aluminum containing 0.2% Cr, 0.05% Mn and 0.1% Zn, at 1050° C. under a protective nitrogen atmosphere in a graphite crucible. The homogeneous Al/Si solution was cooled from 1050° C. to 690° C. at the rate of 60° C./hr., thereby precipitating partially purified silicon platelets. The platelets were separated from the molten aluminum by filtration through a quartz wool filter medium. The recovered platelets were washed in an aqueous HCl solution to remove adherent Al/Si eutectic material and crushed through a 6 mesh screen. The 6/20 mesh fraction was boiled with concentrated HCl and washed with boiling water. Emission spectrographic analysis showed an aluminum content of 1,000–1500 ppm and an iron content of 20–50 ppm in the recovered platelets. One thousand grams of silicon platelets from several such preparations were combined and melted in a graphite crucible at 1500° C. An acid silica slag having 25% CaO, 10% MgO and 65% $SiO_2$ in an amount of about 20% by weight was added to the silicon melt, and the mixture was periodically hand stirred using a graphite rod over a total contact time of 40 minutes. The purified silicon melt was chill cast in a graphite crucible in air, yielding 850 grams of multigrained refined metallurgical silicon (RMS). Elemental analysis showed that said RMS contained about 9 ppm of aluminum, about 13 ppm of iron, about 2 ppm of titanium, about 3 ppm of chromium, about 100 ppm of calcium and about 63 ppm of magnesium. Boron and phosphorus values were not obtained. The resistivity of the RMS was from about 0.1 to about 0.2 ohm-cm.

The RMS was employed as a useful, low-cost intermediate from a melt of which boules of further refined material was pulled on a rotating silicon seed rod utilizing the well-known Czochralski pulling technique. According to this known technique, the seed rod was slowly moved while maintaining an interface between the rod with said boule being grown thereon and the molten silicon from which the boules were pulled. Movement of the seed rod was at about 3.5 inches per hour, with the diameter of the boules being about 2 inches. The resulting Csochralski-pulled material, i.e. CZ-RMS, was a multigrained silicon having a resistivity of from about 0.1 to about 0.2 ohm-cm, having impurity contents of about 1 ppm of aluminum, about 1.1 ppm of iron, less than about 0.5 ppm of titanium, about 0.5 ppm of chromium, less than 0.5 ppm of calcium and less than about 0.5 ppm of magnesium.

The CZ-RMS material thus produces was used as active and passive solar cell substrate material in the production of planar diodes and related solar cell structures. Thus, multigrained p- and n-type epitaxial layers were grown on wafers of said Cz-RMS as a passive silicon substrate in the formation of n-on-p-on p substrate planar diodes and related solar cells by conventional techniques known in the art. Similarly, the Cz-RMS material was employed, in the production of planar diodes and solar cells, as a p-type multigrained silicon substrate into one side of which pentavalent n-type impurities, e.g. phosphorous, was diffused to form a p-n junction by known techniques.

Solar cell efficiencies, measured under Air Mass One conditions, i.e. at 97 milliwatts per centimeter squared, for the passive substrate cell having said epitaxial layers grown thereon, of over 9% were obtained, e.g. 9.2% and 9.4%. Efficiencies of greater than 8% were likewise obtained with solar cells in which said Cz-RMS serves as an active substrate having a p-n junction diffused therein.

EXAMPLE 2

One thousand grams of metallurgical grade silicon containing 0.32% Fe and 0.21% aluminum was dissolved in 3,000 grams of the molten aluminum solvent used in Example 1 at 950° C. in a graphite crucible having a protective nitrogen atmosphere. The resulting melt was cooled at 60° C./hour to 710° C., thereby precipitating relatively pure silicon platelets. The partially purified product was scooped from the melt surface using a perforated graphite bucket and filtered through a quartz wool filter medium. Following washing in aqueous HCl to remove adhering eutectic material as in Example 1, the resulting 6–20 mesh platelet fraction was shown, by emission spectrographic analysis, to contain more than 2,000 ppm of aluminum and less than 30 ppm of iron. A melt of said platelets was contacted, at 1500° C., with an acid slica slag, containing 45% BaO and 55% $SiO_2$, amounting to 20% by weight of the silicon melt. Contact time was about 30 minutes in a quartz container. The resulting multigrained RMS was found, upon elemental analysis, to contain about 15 ppm of aluminum, about 46 ppm of iron, about 14 ppm of titanium, about 1.6 ppm of chromium, about 15 ppm of calcium and about 1.8 ppm of magnesium. Boron and phosphorus were not measured. The resistivity of the material was about 0.1 to about 0.2 ohm-cm. The RMS can be effectively employed as a low-cost intermediate in the production of Cz-RMS as indicated above, with said Cz-RMS being useful as a substrate for the production of epitaxial and/or diffusion type planar diodes and corresponding solar cells having adequate solar cell efficiencies to merit consideration for practical commercial solar cell applications.

EXAMPLE 3

By means of processing similar to that described in the examples above, RMS has been made from acid slica slag containing 25% $Na_2O$ and 75% $SiO_2$. The resultant RMS product is a low-cost, multigrained silicon having a resistivity of from about 0.1 to about 0.2 ohm-cm, with impurity concentrations of about 5.4 ppm of aluminum, about 80 ppm of iron, about 7 ppm of titanium, about 8.8 ppm of chromium, about 1.3 ppm of calcium and about 3.8 ppm of magnesium. Boron and phosphorus contents were not measured. The product RMS can likewise be used in the production of Cz-RMS suitable for use as low-cost substrate material in epitaxial and diffusion type solar cell structures capable of achieving acceptable solar cell efficiencies.

EXAMPLE 4

Metallurgical grade silicon containing 1.25% iron and 0.48% aluminum is dissolved in an aluminum alloy solvent containing 0.2% Cr, 0.05% Mn and 0.1% Zn at 1050° C. The solution, containing 35% Si and 65% Al, is cooled to 710° C. at the rate of 60° C./hour, precipitating partially purified silicon platelets. Following washing with an aqueous HCl solution, said platelets are crushed to a 6–20 mesh size and melted in contact with a 45% BaO/55% $SiO_2$ slag employed in an amount of about 10% by weight of silicon. Upon contact in the melting zone for about 45 minutes at 1450° C., the melt is slowly removed from the melting zone in a unidirectional manner at a rate of about 6 inches in a six hour time period, causing the directional solidification of the refined silicon material and a separate region of solidified melt having a high concentration of impurities rejected by the refined metallurgical silicon as it solidifies. After cropping the top containing said region of solidified melt, the resulting product is a low-cost, multigrained directionally solifified refined metallurgical silicon (DS/RMS) having suitable properties for solar cell applications. Such DS/RMS has a resistivity level of from about 0.04 to about 0.2, typically about 0.1 to about 0.2, ohm-cm and impurity concentrations of less than 1 ppm of aluminum and iron, less than 2 ppm of titanium, less than 5, typically about 3 ppm of phosphorus, less than 1 ppm of chromium, less than 1 ppm of calcium and less than 1 ppm of magnesium. The boron content was not measured.

The DS/RMS product can be employed as a solar cell substrate material directly, or can be further refined, as by the above-indicated Czochralski-type crystal growth to produce both multigrained and single crystal Cz-DS/RMS material. All such materials can be employed as passive substrate wafers upon which epitaxial p- and n-type layers can be grown to form n-on-p-on-p substrate planar diodes and solar cells by conventional techniques. Said materials can also be employed as active p-type substrates upon one side of which pentavalent n-type impurities, such as phosphorus can be diffused to form a p-n junction therein by conventional means known in the art. The single crystal Cz-DS/RMS material can readily be formed by re-melting and re-directionally solidifying said DS/RMS before the pulling of boules therefrom or, less desirably, by re-melting and re-pulling boules from a melt of the boules of multigrained Cz-DS/RMS.

Solar cell efficiencies of about 8.9% have been obtained using the directionally solidified refined, metallurgical silicon (DS/RMS) of the present invention as a passive substrate having epitaxial p- and n-type layers grown thereon by conventional means. Efficiencies of 10.6% for a passive substrate and 9.6% for an active substrate have been obtained utilizing a crystal, pulled DS/RMS material. Using a multigrained, pulled DS/RMS as a passive substrate, solar cell efficiencies of up to 9.6% have been obtained.

It will be understood that all solar efficiencies are on said Air Mass One basis. It will also be appreciated that the claimed melting of partially purified platelets in contact with said silica slag includes also the contacting of a melt of said platelets with the slag to effect the desired removal of aluminum and other impurities as indicated in the examples. It is also pointed out that the silicon products will likely include impurities other than those specifically recited, the latter group being selected on the basis of their general significance to the functioning of the materials for solar cell applications and as distinguishing the products of the invention from those of the prior art. While boron and, in some specific examples, phosphorus were not measured, these impurities were included as being impurity components having some measure of effect on the performance of the products of the invention. The boron and phosphorus levels recited for said impurities have been determined on the basis of the analysis of certain specific samples of the silicon products of the invention and related general information concerning the concentration of such impurities in silicon materials.

The present invention provides a novel process for the production of refined metallurgical silicons having a desirable combination of low-cost and a purity level such that adequate solar efficiencies can be obtained thereby. While the products of the invention are relatively impure as compared to semiconductor grade material, they provide an attractive economic-technical alternative to the use of such high cost, high purity material. Thus, single crystal Cz-DS/RMS material was shown to achieve 10.6% efficiency as a passive substrate. Significantly, multigrained Cz-DS/RMS achieved a 9.6% efficiency, a multigrained Cz-RMS achieved over 9.0% efficiency, e.g. 9.2 and 9.4%, and a DS/RMS, without crystal pulling achieved an efficiency of 8.9%. Adequate solar cell efficiencies can also be achieved with low-cost active substrates made from the DS/RMS product of the present invention and from Cz-modifications of said DS/RMS and the RMS of the present invention.

The present invention thus constitutes a significant advance in the field of solar energy technology. It represents, therefore, a major step in the urgently needed development of solar energy as a commercially feasible, non-polluting energy source for satisfying significant portions of the energy needs of industrial societies throughout the world.

What is claimed is:

1. A process for the production of lowcoat refined metallurgical silicon from metallurgical grade silicon comprising:
   a. dissolving metallurgical grade silicon in a liquid metal solvent to form a liquid metal solvent-silicon solution;
   b. cooling said solution to a temperature at which silicon platelets form;
   c. removing silicon platelets from said solution of metallurgical grade silicon in a liquid metal solvent, thereby recovering partially purified, essentially ironfree silicon platelets with adherent impurities derived from said metal solvent;
   d. melting said partially purified silicon platelets in contact with acid silica slag in a melting zone, the resulting slag oxidation removing residual and adherent impurities from the silicon platelets; and
   e. removing the silicon-slag melt from the melting zone in an unidirectional manner so as to directionally solidify said silicon, said directional solidification resulting in the obtaining of solidified refined metallurgical silicon and a region of solidified melt having a high concentration of impurities rejected by the refined metallurgical silicon as it solidifies, said directionally solidified refined metallurgical silicon comprising a multigrained silicon having a resistivity of from about 0.04 to about 0.2 ohm-cm, said silicon having impurity concentrations of up to, but not exceeding, about 1 ppm of aluminum, about 1 ppm of iron, about 2 ppm of titanium, about 2 ppm of boron, about 2 ppm of phosphorus, about 1 ppm of chromium, about 1 ppm of calcium and about 1 ppm of magnesium, whereby said multigrained refined metallurgical silicon is produced at a substantially higher impurity content level than in a conventional high purity semiconductor grade silicon and has suitable properties for solar cell applications.

2. The process of claim 1 in which said liquid metal solvent is taken from the group consisting of tin, zinc, aluminum, aluminum alloys and silver.

3. The process of claim 2 in which said liquid metal solvent is an aluminum alloy.

4. The process of claim 3 in which said cooling and removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom.

5. The process of claim 4 and including filtering said platelets from said aluminum-silicon solution.

6. The process of claim 4 and including (a) separating a semi-solid mass comprising said platelets and excess aluminum-silicon eutectic from the solution melt, and (b) subjecting said mass to centrifugal filtration to separate the silicon platelets from said excess aluminum-silicon eutectic.

7. The process of claim 5 and including removing adherent aluminum-silicon eutectic from the filtered platelets prior to said melting thereof in contact with silica slag.

8. The process of claim 6 in which said adherent eutectic is removed from the filtered platelets by acid leaching of the filtered platelets.

9. The process of claim 8 in which said acid employed for leaching is an aqueous HCl solution.

10. The process of claim 7 in which the adherent eutectic is removed from the filtered platelets by washing said platelets with anhydrous alcohols, said alcohols reacting with the aluminum in said eutectic to form aluminum alkoxides.

11. The process of claim 10 and including hydrolyzing said aluminum alkoxides to form hydrous aluminum oxide and said alcohol, which can be recycled for the washing of additional platelets.

12. The process of claim 7 in which the partially purified platelets have an iron content not exceeding about 20 ppm and an aluminum content within the range of from about 0.1 to about 0.5% by weight.

13. The process of claim 3 in which said partially purified silicon platelets are contacted with said silica slag at a temperature within the range of from about 1410° C. to about 2000° C.

14. The process of claim 13 in which said temperature is from about 1410° C. to about 1600° C.

15. The process of claim 3 in which said acid silica slag has a Si/O ratio of between about ¼ and ½.

16. The process of claim 3 in which said slag is employed in an amount within the range of from about 8% to about 12% by weight of the silicon platelets melted in contacted therewith.

17. The process of claim 16 in which said slag is employed in an amount comprising about 10% by weight of said silicon platelets.

18. The process of claim 17 in which said silica slag is of high purity, the concentration of each impurity in the slag reducible by molten silicon at the silicon platelet-silica slag contacting temperature being less than about 10 ppm.

19. The process of claim 3 in which the silicon-slag melt is slowly withdrawn, in its refining crucible, from said melting zone.

20. The process of claim 19 and including mechanically separating said refined metallurgical silicon from said solidified melt of high impurity concentration.

21. The process of claim 19 in which the refining crucible is slowly lowered from said melting zone.

22. A process for the production of low-cost refined metallurgical silicon from metallurgical grade silicon comprising:
   a. dissolving metallurgical grade silicon in molten aluminum to form a liquid aluminum-silicon solution;
   b. cooling said liquid solution to a temperature not below the eutectic temperature of about 577° C., thus forming a supersaturated aluminum-silicon solution and causing partially purified, essentially iron-free silicon platelets to precipitate therefrom;
   c. filtering said partially purified platelets from said solution, said as-filtered platelets having adherent eutectic thereon;
   d. melting said partially purified silicon platelets in contact with acid silica slag in a melting zone at a temperature of from about 1410° C. to about 2000° C. to remove, by oxidation, aluminum from silicon, the resultant $Al_2O_3$ dissolving into said slag; and
   e. removing the silicon-slag melt from said melting zone in a unidirectional manner so as to directionally solidify said silicon, said directional solidification resulting in the obtaining of refined metallurgical silicon separated from a region of solidified melt having therein a high concentration of impurities and the product of the slag-melt reaction rejected by the silicon as it solidifies, said directionally solidified refined metallurgical silicon comprising a multigrained silicon having a resistivity of from about 0.04 to 0.2 ohm-cm, said silicon having impurity concentrations of up to, but not exceeding, about 1 ppm of aluminum, about 1 ppm or iron, about 2 ppm of titanium, about 2 ppm of boron, about 2 ppm of phosphorus, about 1 ppm of chromium, about 1 ppm of calcium and about 1 ppm of magnesium,
whereby said multigrained refined metallurgical silicon is produced at a substantially higher impurity content level than in a conventional high purity semiconductor grade silicon and has suitable properties for solar cell applications.

23. The process of claim 22 in which the filtering of said precipitated platelets is accomplished by centrifugal filtration to separate excess aluminum-silicon eutectic therefrom, a semi-solid mass of platelets and excess eutectic having been first separated from the solution melt following said precipitation of platelets.

24. The process of claim 23 in which the washing of said filtered platelets comprises acid leaching said platelets with an aqueous HCl solution.

25. The process of claim 23 in which the washing of said platelets comprises washing with anhydrous alcohols, which react with aluminum in said eutectic to form aluminum alkoxides and including hydrolyzing said alkoxides to form hydrous aluminum oxide and said alcohol, which can be recycled for the washing of additional platelets.

26. The process of claim 23 in which said partially purified silicon platelets are contacted with said silica slag at a temperature of from about 1410° C. to about 1600° C.

27. The process of claim 26 in which said temperature is from 1410° C. to about 1500° C.

28. The process of claim 24 in which said acid silica slag has a Si/O ratio of between about ¼ and ½, said slag being employed in amount within the range of from about 8% to about 12% by weight of the silicon platelets melted in contact therewith.

29. The process of claim 28 in which said silica slag is of high purity, the concentration of each impurity in the slag reducible by molten silicon at the silicon platelet-silica slag contacting temperature being less than about 10 ppm.

30. The process of claim 23 in which the silicon slag melt is slowly withdrawn, in its refining crucible, from said melting zone.

31. The process of claim 30 in which said refining crucible is slowly lowered from said melting zone.

32. A process for the production of lowcost refined metallurgical silicon from metallurgical grade silicon comprising:
   a. dissolving metallurgical grade silicon in a liquid metal solvent to form a liquid metal solvent-silicon solution;
   b. cooling said solution to a temperature at which silicon platelets form
   c. removing silicon platelets from said solution of metallurgical grade silicon in a liquid metal solvent, thereby recovering partially purified, essentially iron-free silicon platelets with adherent impurities derived from said metal solvent;
   d. melting said partially purified silicon platelets in contact with acid silica slag in a melting zone, the resulting slag oxidation removing residual and adherent impurities from the silicon platelets; and
   e. cooling the thus-slagged silicon, said refined metallurgical silicon comprising a multigrained silicon having a resistivity of from about 0.04 to about 0.2 ohm-cm, said silicon having impurity concentrations of up to, but not exceeding, about 15 ppm of aluminum, about 80 ppm of iron, about 15 ppm of titanium, about 2 ppm of boron, about 2 ppm of phosphorus, about 10 ppm of chromium, about 100 ppm of calcium, and about 65 ppm of magnesium,
whereby said, multigrained refined metallurgical silicon is produced at a substantially higher impurity content level than in a conventional high purity semiconductor grade silicon and has suitable properties for use in solar cell applications.

33. The process of claim 32 in which said liquid metal solvent comprises aluminum.

34. The process of claim 33 in which said cooling and removing of silicon platelets from solution comprises cooling the liquid solution of silicon in molten aluminum to a temperature not below the eutectic temperature of about 577° C., thus forming a supersaturated hypereutectic aluminum-silicon solution and causing silicon platelets to precipitate therefrom, and including filtering said platelets from said aluminum-silicon solution and removing adherent aluminum-silicon eutectic therefrom.

35. The process of claim 34 in which adherent eutectic is removed from the platelets by acid leaching of the filtered platelets.

36. The process of claim 34 in which adherent eutectic is removed from the filtered platelets by the washing thereof with anhydrous alcohols, said alcohols reacting with the aluminum in said eutectic to form aluminum alkoxides.

37. The process of claim 34 in which said partially purified platelets are contacted with said silica slag at a temperature of from about 1410° C. to about 2000° C.

38. The process of claim 37 in which said temperature is from about 1410° C. to about 1600° C., said slag having an Si/O ratio of between about ¼ and about ½, said slag being employed in an amount within the range of from about 8% to about 12% based on the weight of the silicon platelets melted in contact therewith.

39. The process of claim 38 in which said slag is of high purity, the concentration of each impurity in the slag reducible by molten silicon at the silicon platelet-silica slag contacting temperature being less than about 10 ppm.

40. The process of claim 34 in which the filtering of said precipitated platelets is accomplished by centrifugal filtration to separate excess aluminum-silicon eutectic therefrom, a semi-solid mass of platelets and excess eutectic having been first separated from the solution melt following said precipitation of platelets.

* * * * *